(12) United States Patent  
Perroni et al.

(10) Patent No.: US 8,441,865 B2  
(45) Date of Patent: May 14, 2013

(54) NON-VOLATILE MEMORY DEVICE WITH CONTROLLED DISCHARGE

(75) Inventors: Maurizio Francesco Perroni, Furnari (IT); Giuseppe Castagna, Palermo (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 160 days.

(21) Appl. No.: 13/156,360

(22) Filed: Jun. 9, 2011

(65) Prior Publication Data

US 2011/0305092 A1    Dec. 15, 2011

(30) Foreign Application Priority Data

Jun. 15, 2010   (IT) ............................... MI2010A1082

(51) Int. Cl.
 *G11C 16/04* (2006.01)
(52) U.S. Cl.
 USPC ............ 365/185.27; 365/185.18; 365/185.23; 365/185.25
(58) Field of Classification Search .................... None
 See application file for complete search history.

(56) References Cited

U.S. PATENT DOCUMENTS

| | | | |
|---|---|---|---|
| 4,769,787 A | 9/1988 | Furusawa et al. | |
| 4,797,857 A | 1/1989 | Schreck et al. | |
| 6,373,749 B1 | 4/2002 | Atsumi et al. | |
| 7,791,943 B2 * | 9/2010 | Ishii et al. ................ | 365/185.18 |
| 2001/0020718 A1 | 9/2001 | Takahashi et al. | |
| 2006/0104122 A1 | 5/2006 | Choy | |
| 2009/0175081 A1 | 7/2009 | Kim | |

FOREIGN PATENT DOCUMENTS

WO    WO 2006/033832 A2    3/2006

OTHER PUBLICATIONS

Italian Search Report dated Dec. 15, 2010 from corresponding Italian Application No. MI20101082.
Written Opinion dated Dec. 15, 2010 from corresponding Italian Application No. MI20101082.
Italian Search Report dated Dec. 17, 2010 from related Italian Application No. MI20101081.
Written Opinion dated Dec. 17, 2010 from related Italian Application No. MI20101081.

* cited by examiner

*Primary Examiner* — Tan T. Nguyen
(74) *Attorney, Agent, or Firm* — Wolf, Greenfield & Sacks, P.C.

(57) ABSTRACT

An electrically programmable non-volatile memory device being integrated on a chip of semiconductor material is proposed. The memory device includes a plurality of sectors of memory cells each one being formed in a respective well of the chip; each sector includes a plurality word lines each one for accessing a corresponding block of memory cells of the sector; the memory device includes a first biasing line of the wells and a second biasing line of the word lines, biasing circuitry for providing a first bias voltage to the first biasing line and a second bias voltage to the second biasing line, selection circuitry for selectively connecting the first biasing line to the well of at least one selected sector and for selectively connecting the second biasing line to at least one selected word line of each selected sector, first charge transfer circuitry for bringing the first biasing line from the first bias voltage to a target voltage according to a pilot transient trend, the target voltage being between the first bias voltage and the second bias voltage, second charge transfer circuitry for bringing the second biasing line from the second bias voltage to the target voltage. The second charge transfer circuitry includes circuitry for binding the second biasing line to bring itself from the second bias voltage to the target voltage according to a transient trend being scaled with respect to the pilot transient trend.

11 Claims, 6 Drawing Sheets

NON-VOLATILE MEMORY DEVICE WITH CONTROLLED DISCHARGE

CROSS REFERENCE TO RELATED APPLICATIONS

This application claims the priority benefit of Italian patent application number MI2010A0001082, filed on Jun. 15, 2010, entitled NON-VOLATILE MEMORY DEVICE WITH CONTROLLED DISCHARGE, which is hereby incorporated by reference to the maximum extent allowable by law.

BACKGROUND OF THE INVENTION

1. Field of the Invention

The solution according to one or more embodiments of the present invention relates to the electronics field. More specifically, such a solution relates to non-volatile memory devices.

2. Discussion of the Related Art

Non-volatile memory devices are used in whatever application that requires the storage of binary digits (or bits) of information that should be held even when the memory devices are not powered.

An example of such devices is represented by flash memory devices being integrated in chips of semiconductor material. In general, each flash memory device includes a plurality of sectors of electrically erasable and programmable memory cells; each sector is formed in a respective electrically isolated well of the chip. Each memory cell typically includes an N-channel MOS transistor with a floating gate structure; such transistor has a drain terminal, a source terminal and a gate terminal, in a completely similar manner to a standard MOS transistor, with the addition of a further floating gate region that is buried within an oxide layer so as to be electrically isolated.

The information bit is physically stored within each memory cell in the form of electrical charge within the floating gate, which defines a corresponding threshold voltage of the transistor; in particular, the memory cell is erased at a low threshold voltage (floating gate being free from electric charges) and programmed at a high threshold voltage (electrical charges being trapped in the floating gate). As is known, in flash memory devices, the programming can be performed on individually selected memory cells, whereas the erasing can be performed only for whole selected sectors (even concurrently on more of them). In particular, for erasing a selected sector, a very high voltage difference is applied between the well thereof and the control terminals of the respective memory cells; this is typically performed by biasing the well to a very high positive voltage (e.g., 8V) and the control terminals to a negative voltage being very high in absolute value (e.g., −8V).

Although flash memory devices offer high performance in terms of speed and functionality, they still have drawbacks that, in high-performance applications (such as automotive applications), may even significantly limit reliability and robustness thereof.

In particular, after the erasing of selected sectors, the respective control terminals and wells should be properly de-biased (through positive and negative discharges, respectively) so as to enable their efficient re-biasing in subsequent operations. To such purpose, each sector of the flash memory device includes a respective dedicated discharge circuit (or sector discharger) for discharging the corresponding well; instead, the flash memory device includes a common discharge circuit (or central discharger) being shared by all the sectors of the flash memory device for selectively discharging the control terminals of all the memory cells of the selected sectors.

However, such de-biasing operation has criticalities due to parasitic couplings, which generally can be modelled as an equivalent capacitive coupling between the control terminals of the memory cells of each sector and the respective well; in particular, such parasitic couplings may include parasitic diodes at the interface of diffusions having different doping (e.g., between the P-doped well and N-doped diffusions) and parasitic capacitors between conductive elements (e.g., between the control terminal and the source terminal of each memory cell).

Moreover, since the control terminals of the memory cells of all the selected sectors are concurrently connected to the central discharger, the latter is coupled (through a total capacitive coupling given by the sum of all the equivalent capacitive couplings of each selected sector) to the sector dischargers of the selected sectors, which affect the respective discharges during the de-biasing operation. In addition, since such total capacitive coupling depends on a number (being variable from time to time) of selected sectors, the discharge of the control terminals (being performed by the central discharger) and that of the wells (being performed by the respective sector dischargers) will have a trend being unpredictable a priori and variable from time to time.

In particular, such total capacitive coupling in some cases may involve spurious voltage glitches on the control terminals with even very high values (e.g., −10V) and not negligible durations; this causes a substantial impossibility to ensure a full functionality of the flash memory device, since such spurious voltage glitches, causing dangerous electrical stresses, may involve a degradation in performance and reliability of the flash memory device, or even its breakage in relatively short times.

SUMMARY OF THE INVENTION

In its general terms, a solution according to one or more embodiments is based on the idea of binding the discharge of the control terminals to the discharge of the wells.

In particular, one or more embodiments of the invention are set out in the independent claims, with advantageous features of the same solution that are indicated in the dependent claims (whose wording is incorporated herein verbatim by reference).

More specifically, an embodiment proposes an electrically programmable non-volatile memory device being integrated within a chip of semiconductor material. The memory device includes a plurality of sectors of memory cells each one being formed in a respective well of the chip; each sector includes a plurality word lines each one for accessing a corresponding block of memory cells of the sector; the memory device includes a first biasing line of the wells and a second biasing line of the word lines, biasing means for providing a first bias voltage to the first biasing line and a second bias voltage to the second biasing line, selection means for selectively connecting the first biasing line to the well of at least one selected sector and for selectively connecting the second biasing line to at least one selected word line of each selected sector, first charge transfer means for bringing the first biasing line from the first bias voltage to a target voltage according to a pilot transient trend, the target voltage being comprised between the first bias voltage and the second bias voltage, second charge transfer means for bringing the second biasing line from the second bias voltage to the target voltage. The second charge transfer means includes means for binding the second biasing line to bring itself from the second bias voltage to the target voltage according to a transient trend being scaled with respect to the pilot transient trend.

A further aspect of the solution according to an embodiment proposes a system including one or more of such memory devices.

Another aspect of the solution according to an embodiment proposes a corresponding method for controlling a charge transfer (with the same advantageous features being recited in the dependent claims for the memory device that apply mutatis mutandis to the method).

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
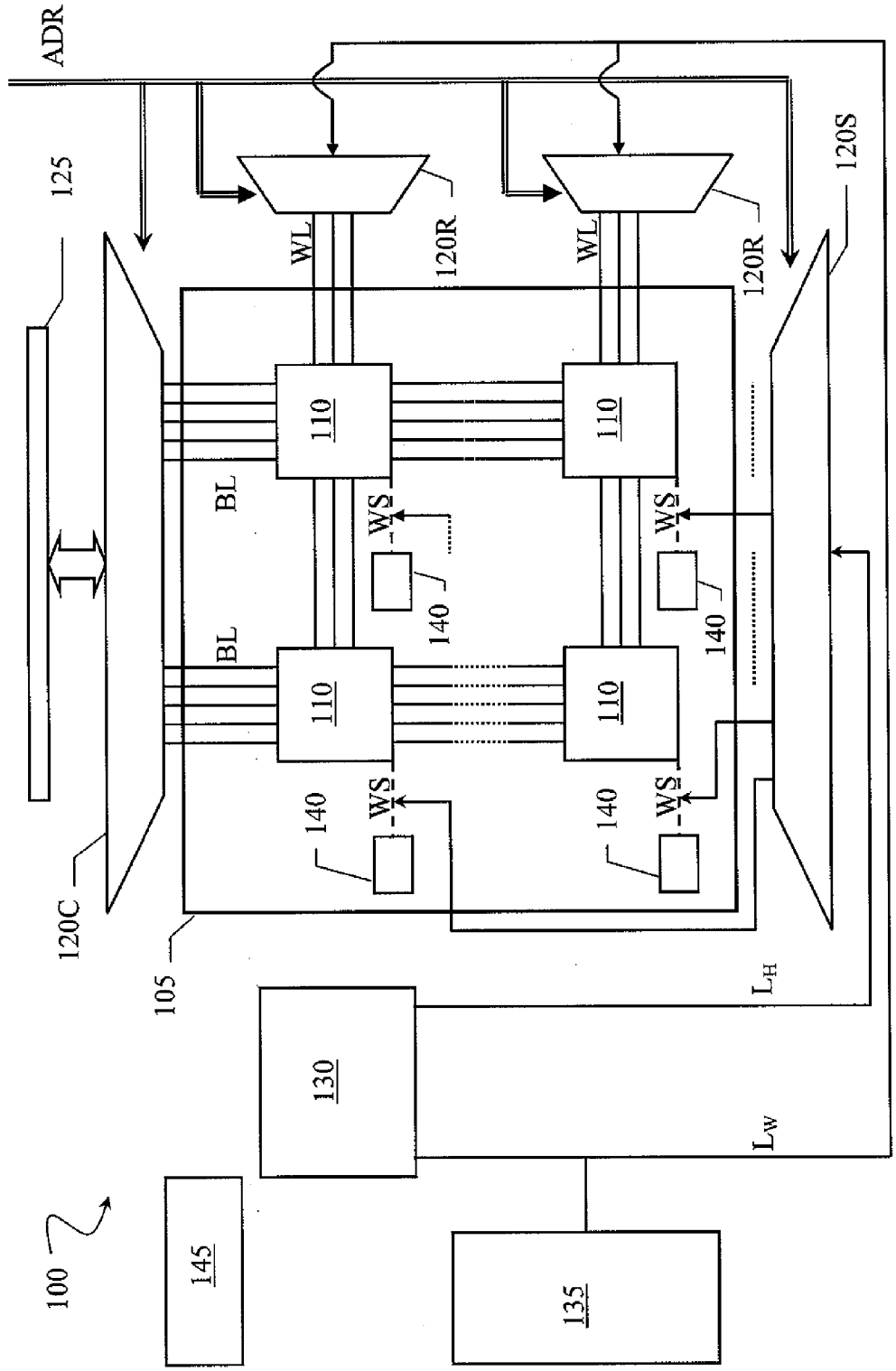
FIG. 1 is a principle block scheme of a flash memory device in which the solution according to an embodiment of the present invention is applicable.

With particular reference to FIG. 1, there is shown a principle block scheme of a flash memory device 100 according to an embodiment.

The flash memory device 100 is integrated on a chip of semiconductor material; the flash memory device 100 includes a memory matrix 105, which is formed by a plurality of sectors 110 (only four shown in the figure) of electrically erasable and programmable memory cells being organized into rows and columns (e.g., 128-512 rows and 512-1024 columns). Each sector 110 is formed in a respective electrically isolated well (not visible in the figure) of the chip. On each selected sector 110 different operations can be performed, and in particular the programming and reading of selected memory cells, and the erasing of all the memory cells of the sector 110. In the following, for the sake of brevity and clarity of exposition, there will be introduced and described only functional blocks (relevant to the solution according to an embodiment) being directly involved in the erasing operations of the sectors 110.

The matrix 105 includes a plurality of bit lines BL each one for accessing a column of memory cells in a column of sectors 110 of the matrix 105, and a plurality of word lines WL, each one for accessing a row of memory cells in a row of sectors 110 of the matrix 105. The matrix 105 also includes a plurality of sectors lines or well lines WS, each one for accessing the well of a sector 110.

The memory cells are selected through a corresponding address ADR being received from the outside of the flash memory device 100. To such purpose, the flash memory device 100 includes a row selector 120R for each row of sectors 110 of the matrix 105 (for selecting the corresponding word lines WL in response to a portion of the address ADR), a column selector 120C (for selecting the bit lines BL in response to another portion of the address ADR), and a sector selector 120S (for selecting the wells of the sectors 110 in response to a further portion of the address ADR). The column selector 120C interfaces with an input/output (I/O) block 125, which includes circuits being used to perform the different operations on the selected memory cells (e.g., biasing circuits, comparators, and so on).

The flash memory device 100 also includes a driver circuit 130, which provides different bias voltages being necessary for the execution of the desired operations on the selected memory cells. Considering in particular the erasing operation of all the memory cells of one or more selected sectors 110, the driver circuit 130 provides a very high erasing voltage (e.g., $V_{HIGH}$=8V) to a biasing line $L_H$, and an erasing voltage being very high in absolute value (e.g., $V_{LOW}$=−8V) to a biasing line $L_W$. The sector selector 120S selectively connects the biasing line $L_H$ to the well line WS of each selected sector 110 (to be erased), and the biasing line $L_W$ to all the word lines WL of each selected sector 110.

The erasing operation is then followed by a de-biasing operation of the word lines WL and of the well lines WS of the selected sectors 110, in which they are brought to a same target voltage $V_{TARGET}$ (e.g., equal to a ground voltage of 0V); in order to do that, the word lines WL of the selected sectors 110 are subject to a negative discharge operation from the erasing voltage $V_{LOW}$, and the well lines WS of the selected sectors 110 are subject to a positive discharge from the erasing voltage $V_{HIGH}$. To such purpose, the flash memory device 100 typically includes a central discharger 135 being connected to the biasing line $L_W$ for discharging it (and hence for discharging the word lines WL being connected thereto through the active row selectors 120R), and a plurality of sector dischargers 140, each one of which is connected to the well of a corresponding sector 110 for discharging it individually (and hence for discharging the biasing line $L_H$ being connected thereto through the sector selector 120S as well).

The flash memory device 100 also includes a microcontroller 145, which generally accomplishes functions of management and control of the flash memory device 100.

Figure 2A:
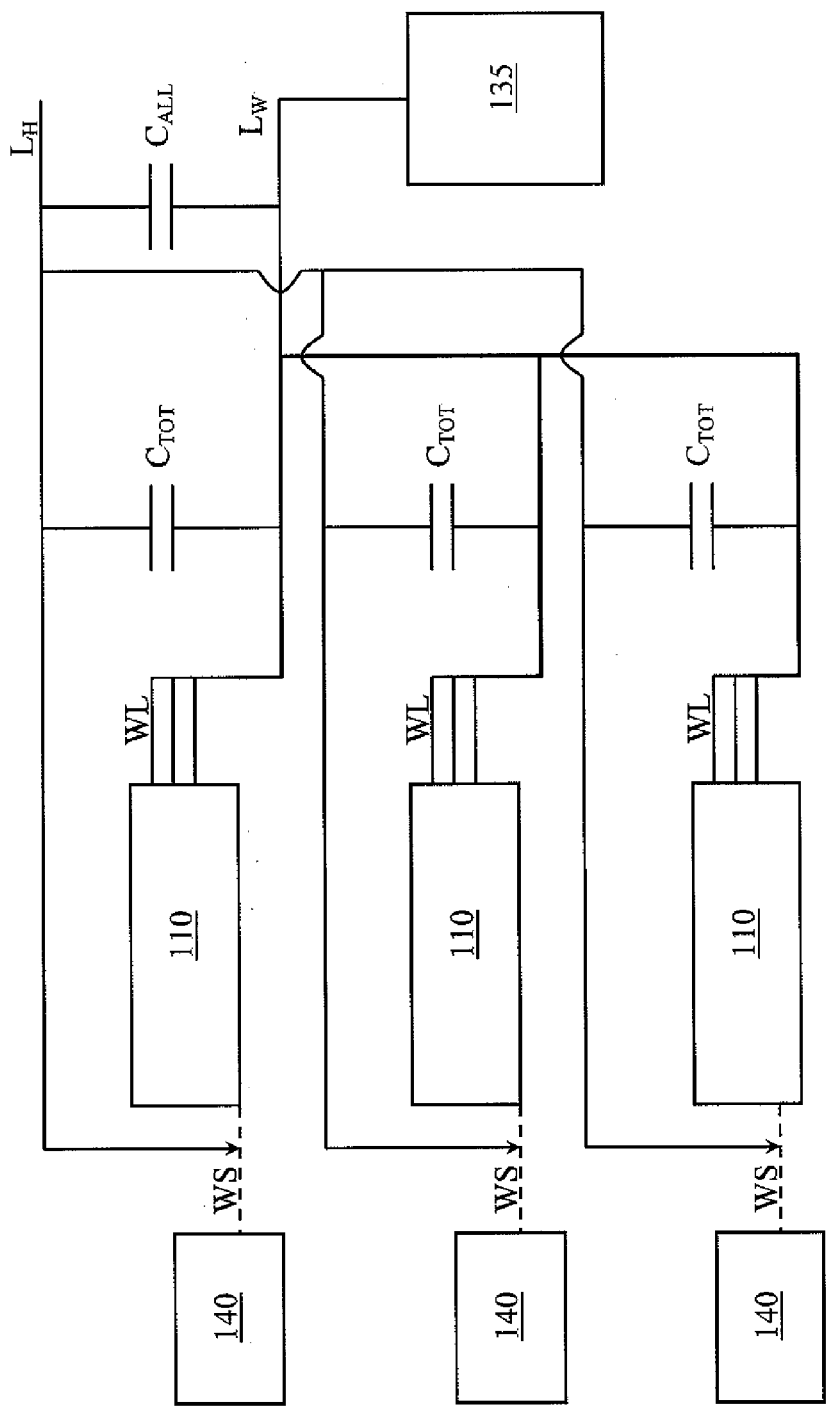
FIG. 2A-2B show a schematic representation of significant electrical couplings within the memory device of FIG. 1 and a corresponding trend of some voltages thereof, respectively.

Turning now to FIG. 2A, there is shown a schematic representation of significant electrical couplings within the flash memory device of FIG. 1 during the above-described de-biasing operation. Since each memory cell (not shown in the figure) within the respective sector 110 has an equivalent parasitic capacitive coupling between a control terminal thereof (being connected to a corresponding word line WL) and the corresponding well, between the word lines WL of the selected sectors 110 (being connected to the biasing line $L_W$) and the well of the respective sector 110 (being connected to the biasing line $L_H$) there is a total parasitic capacitive coupling being represented in the figure through an equivalent capacitor $C_{TOT}$ (whose capacity is given by the sum of the equivalent capacitive coupling of all the memory cells of the same sector 110); therefore, between the biasing lines $L_H$ and $L_W$ there is an overall parasitic capacitive coupling being represented in the figure through an equivalent capacitor $C_{ALL}$, whose capacity is given by the sum of the capacities of the capacitors $C_{TOT}$ (being in parallel to each other) of the selected sectors 110; such overall capacitive coupling $C_{ALL}$ involves a corresponding undesired coupling between the central discharger 135 and the sector dischargers 140 (with a corresponding alteration of discharge transient trends on the biasing lines $L_H, L_W$).

Figure 2B:
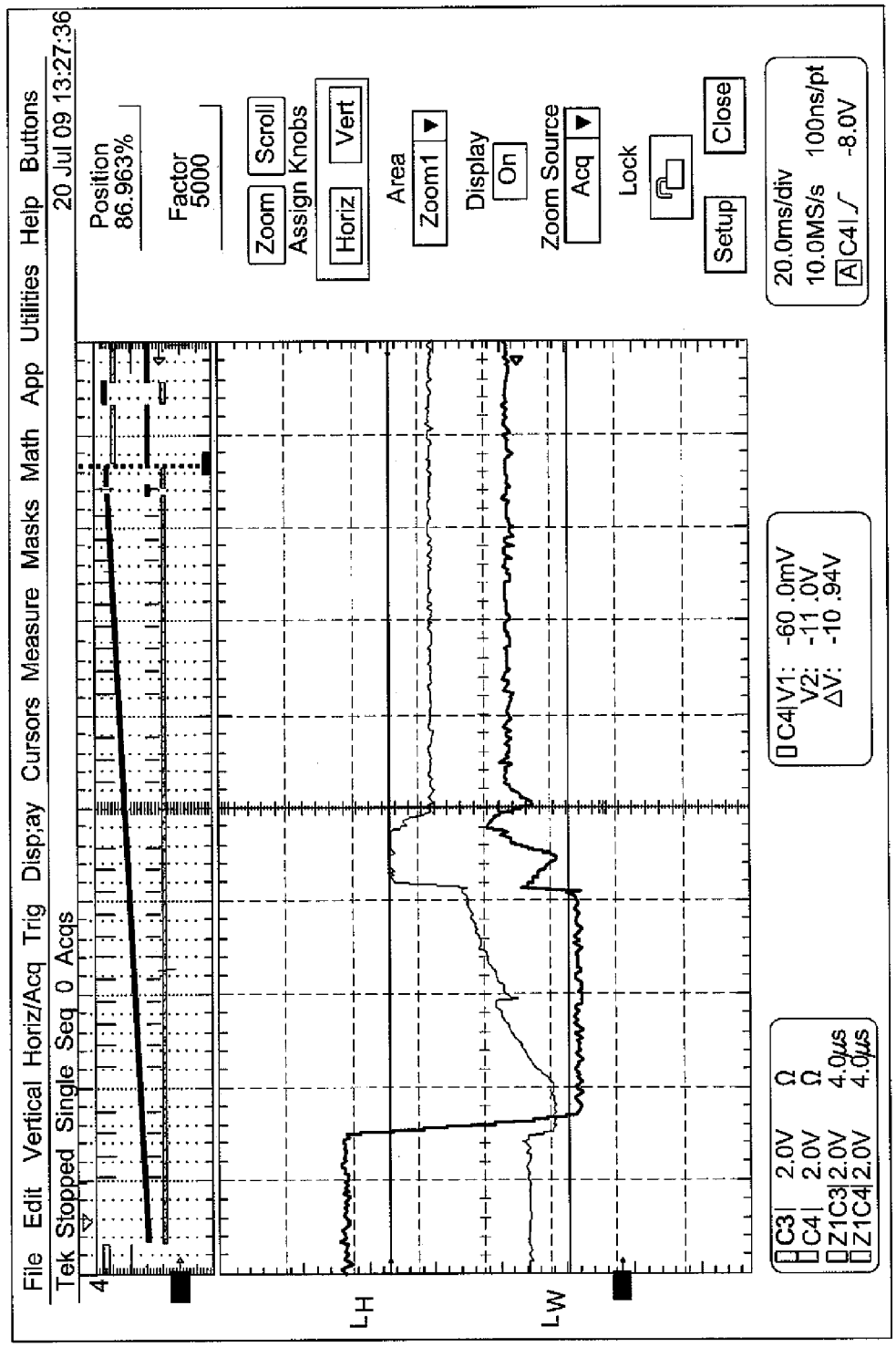

Turning now to FIG. 2B, there are shown the trends of the discharge transients of the voltages on the biasing lines $L_W, L_H$ (indicated with the same references for simplicity). As visible in such figure, during the discharge transients, the biasing lines $L_W, L_H$ reach voltages being very high in absolute values (e.g., −10V on the biasing line $L_H$) for relatively long periods of time (e.g., 0.4 μs) which may cause malfunctions of the flash memory device, or even the breakage thereof.

Figure 3:
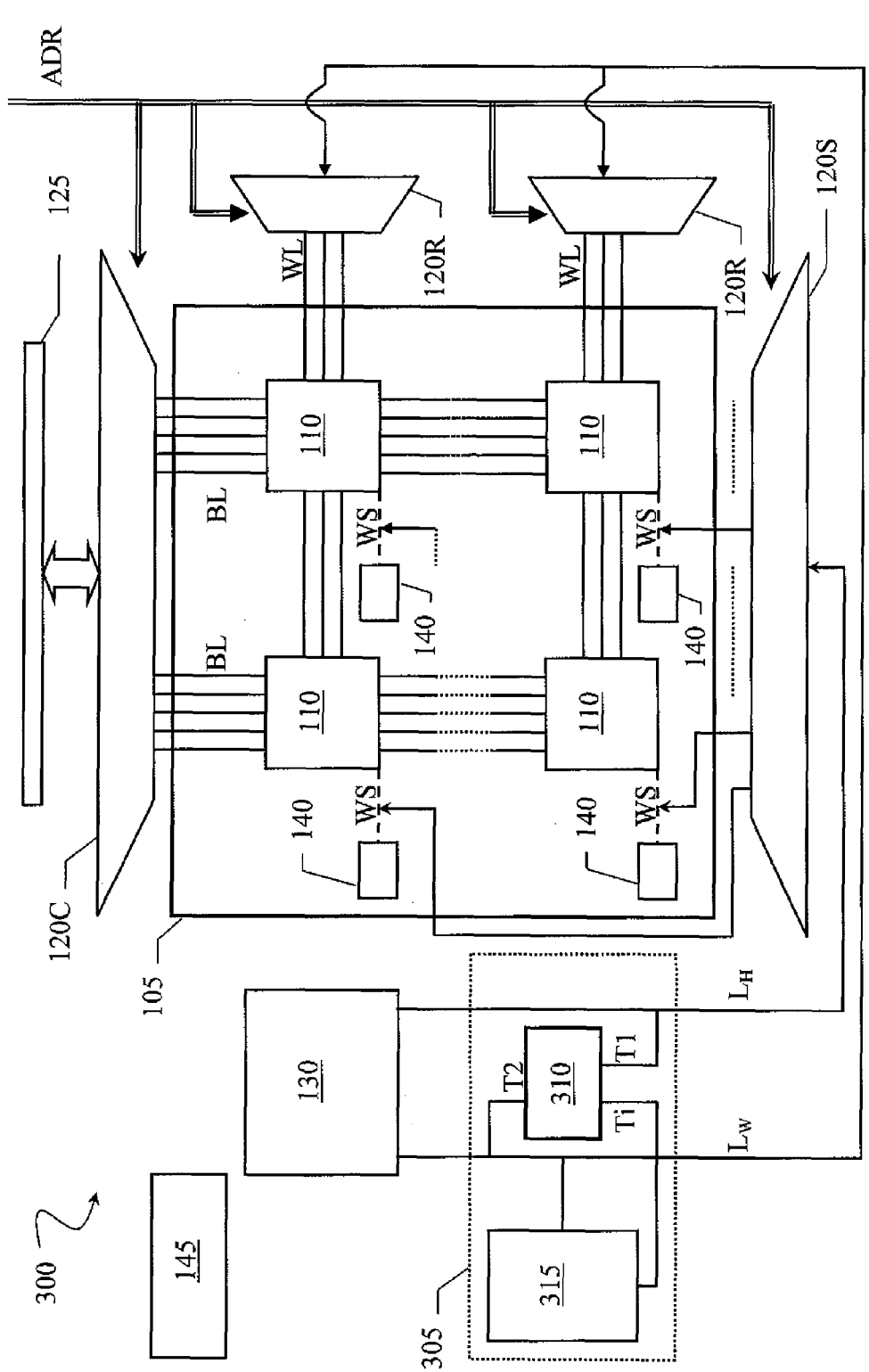
FIG. 3 is a principle block scheme of a flash memory device according to an embodiment of the present invention.

With reference now to FIG. 3, there is shown a principle block diagram of a flash memory device 300 according to an embodiment. The flash memory device 300 is similar to the above-described flash memory device, but differs from the latter for the presence of a central discharge block 305 being structurally and functionally different from the previous central discharger. In particular, the central discharge block 305 includes a coupling block 310 for coupling to each other the biasing lines $L_W$ and $L_H$ and a regulated discharger 315 for controlling the discharge of the biasing line $L_W$.

More in detail, the coupling block 310 includes a terminal T1 being connected to the biasing line $L_H$, another terminal T2 being connected to the biasing line $L_W$, and an intermediate terminal Ti for receiving the target voltage $V_{TARGET}$ (to which both the biasing lines $L_H$ and $L_W$ should be brought— i.e., 0V in the example at issue).

The regulated discharger 315 is connected to the biasing line $L_W$ (and thus to the terminal T2) and to the terminal Ti; the regulated discharger 315 allows discharging the biasing line $L_W$ like the known central discharger, but differently form the latter, it performs a controlled discharge by interacting with the coupling block 310. In particular, the regulated discharger 315 regulates the terminal Ti of the coupling block 310 at the target voltage $V_{TARGET}$ for any voltage variation at its terminal T2 and without current absorption; in this way, for any voltage variation at the terminal T2 there is a corresponding voltage variation at the terminal T1. In this way, by suitably sizing the coupling block 310 (as will be described more in detail in the following), it is possible to bind the discharge of the biasing line $L_W$ only to the discharge of the biasing line $L_H$.

Such solution is particularly advantageous since it allows discharging the biasing lines $L_H$ and $L_W$ regardless of the number of selected sectors 110, i.e., regardless of the overall capacitive coupling between the regulated discharger 310 and the active sector dischargers 140. In this way, the discharge of the control terminals and that of the wells will have a trend being well definable a priori at each de-biasing operation. Therefore, the described solution allows substantially avoiding any voltage glitch on the control terminals of the memory cells; this allows ensuring a full functionality of the flash memory device, since the latter is not subject to dangerous electrical stresses during the discharge. Ultimately, the flash memory device according to the described embodiment is able to ensure nominal (i.e., declared by a producer) levels of performance and reliability.

Figure 4A:
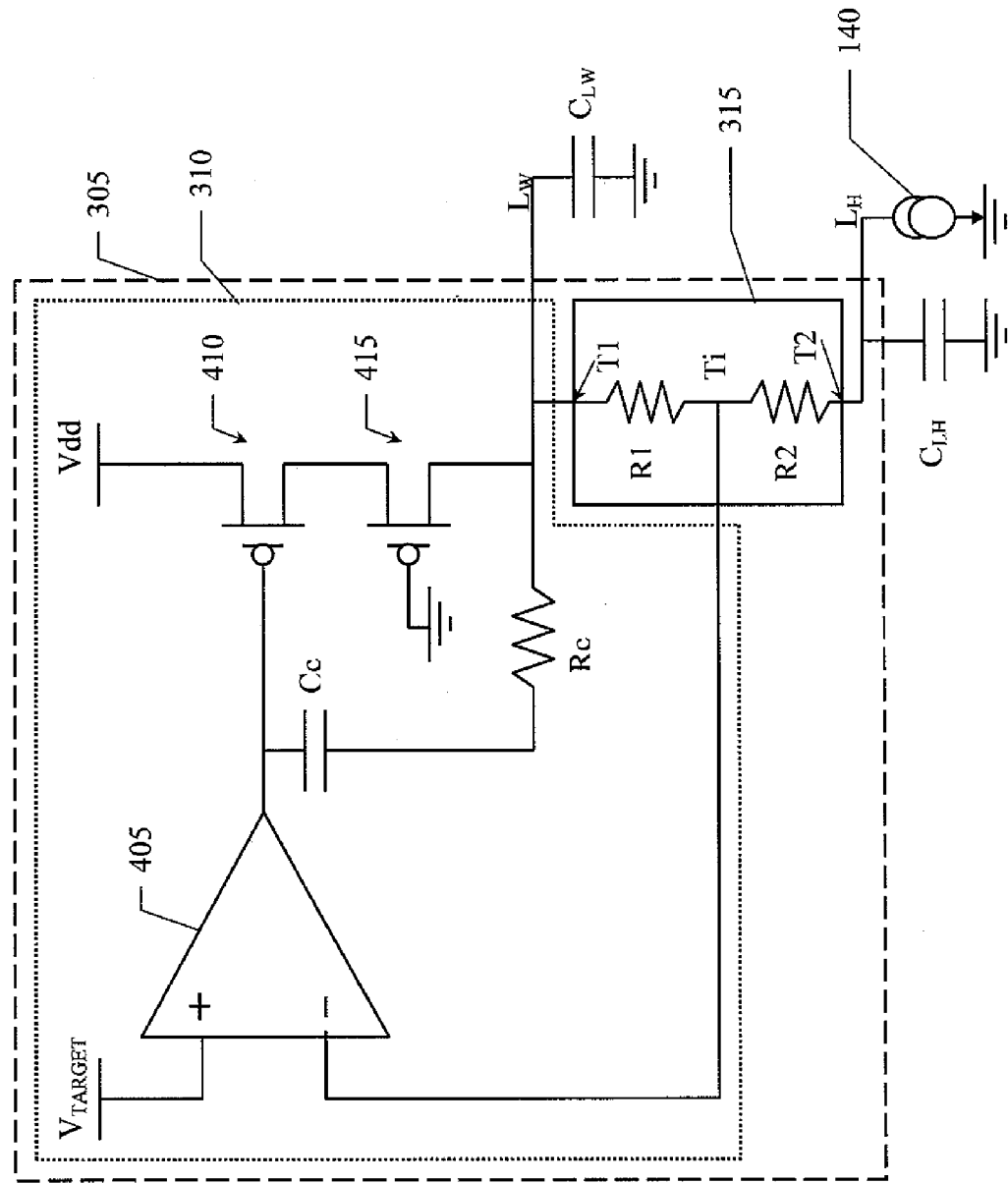
FIG. 4A-4B show a circuit implementation of a discharge block of the flash memory device of FIG. 3 according to an embodiment of the present invention, and a corresponding trend of the same voltages against a driven capacitive load.
Figure 4B:
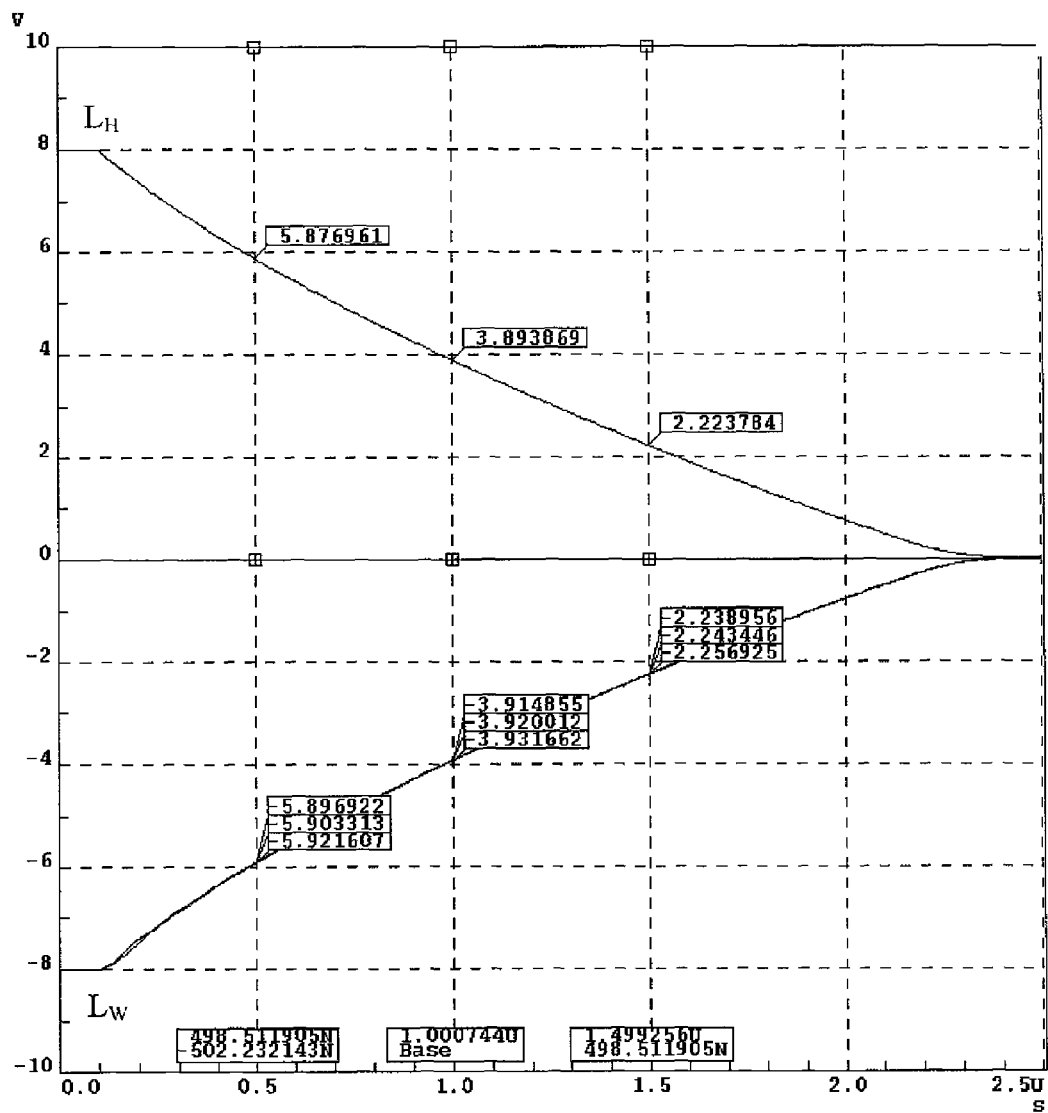

Turning to FIG. 4A-4B, they show a circuit implementation of the central discharge block 305 of the flash memory device 300 according to an embodiment, and a corresponding trend of the voltages $L_H, L_W$.

With particular reference to FIG. 4A, the regulated discharger 310 includes an operational amplifier 405, which has a non-inverting terminal (indicated by the symbol "+") for receiving the target voltage $V_{TARGET}$, an inverting terminal (indicated by the symbol "−") being connected to the intermediate terminal Ti, and an output terminal. The regulated discharger 310 also includes a discharge transistor 410 (e.g., of the P-channel MOS type) for discharging the biasing line $L_W$; the discharge transistor 410 has a source terminal being connected to a terminal providing a supply voltage Vdd, a gate terminal being connected to the output terminal of the operational amplifier 405, and a drain terminal. The regulated discharger 310 further includes a protection transistor 415 (e.g., of the P-channel MOS type as well) for limiting a voltage difference between the source and drain terminals of the discharge transistor 410, when the latter is turned on. The protection transistor 415 has a source terminal being connected to the drain terminal of the discharge transistor 410, a gate terminal being connected to the ground terminal, and a drain terminal being connected to the terminal T1 of the coupling block 315. The regulated discharger 310 also includes a frequency compensation network of the known type, which includes, for example, a compensation resistor $R_C$ and a compensation capacitor $C_C$; the latter has a terminal being connected to the output terminal of the operational amplifier 405 (i.e., to the gate terminal of the discharge transistor 410), and a terminal being connected to a terminal of the compensation resistor $R_C$; the other terminal of the compensation resistor $R_C$ is connected to the terminal T1 of the coupling block 315 (i.e., to the drain terminal of the protection transistor 415). A capacitor $C_{LW}$ (with a first terminal being connected to the biasing line $L_W$ and a second terminal being connected to the ground terminal) is depicted in the figure for modelling a capacitive load being associated with the biasing line $L_W$.

The coupling block 315 includes a resistive divider including a resistor R1 and another resistor R2 being connected in series between the biasing lines $L_H, L_W$; in particular, a first terminal of the resistor R1,R2 is connected to the terminal T1,T2 (i.e., to the biasing lines $L_H, L_W$), while a second terminal of the resistor R1,R2 is connected to the intermediate terminal Ti. In the exemplary but not limitative described embodiment, the resistors R1,R2 have the same resistance value of relatively high value (e.g., of about 100KΩ), so as to limit leakage currents across them. As in the foregoing, a capacitor $C_{LH}$ (with a first terminal being connected to the biasing line $L_H$ and a second terminal being connected to the ground terminal) is depicted in the figure for modelling a capacitive load being associated with the biasing line $L_H$; it should be noted that the capacitors $C_{LW}, C_{LH}$ also include the overall parasitic capacitive coupling (properly decomposed) between the biasing lines $L_H, L_W$. The biasing line $L_H$ is connected to the sector discharger 140, which is modelled through a direct current source towards the ground terminal.

The operation of the central discharge block 305 according to the above-described embodiment can be summarized as follows (with reference to FIG. 4B jointly to FIG. 4A).

The discharge operation should bring both the biasing lines $L_H, L_W$ to the same target voltage $V_{TARGET}$; in such condition, also the voltage at the terminal Ti should have the same value $V_{TARGET}$. Since the voltage at the terminal Ti, brought back to the inverting input terminal of the operational amplifier 405 is always equal to the voltage at its non-inverting terminal (for the well-known virtual ground principle), this justifies the application of the target voltage $V_{TARGET}$ to such terminal.

At the start of the of discharge operation (time $t_0$=0 μs), the central discharge block 305 is in an equilibrium condition; in such condition the biasing lines $L_H, L_W$ are biased to the corresponding erasing voltages $V_{HIGH}, V_{LOW}$ (i.e., the capacitors $C_{LH}, C_{LW}$ are charged to the voltages $V_{HIGH}=8V$, $V_{LOW}=-8V$, respectively), and as a consequence also the terminals T1,T2 are at a voltage value $V_{T1}, V_{T2}$ being equal to $V_{HIGH}$, $V_{LOW}$ respectively. The inverting terminal (−) of the operational amplifier 405 does not absorb current (exhibiting an ideally infinite impedance), while the divider R1,R2 conducts a leakage current (in any case of negligible value, for example, 1 µA, because of the high resistance value being chosen for the resistors R1,R2) due to the voltage difference across it; for this reason, the divider R1,R2 in equilibrium condition should in any case satisfy a balance of (leakage) current across the resistors R1 and R2; in particular, by indicating with $V_{Ti}$ the voltage at the terminal Ti, there is that $$\frac{V_{T1} - V_{Ti}}{R1} = \frac{V_{Ti} - V_{T2}}{R2},$$

from which it is obtained that the voltage $V_{Ti}$ is given by the following relationship:

$$V_{Ti} = \frac{1}{R1 + R2}(V_{T1} \cdot R2 + V_{T2} \cdot R1).$$

Being $V_{Ti} = V_{TARGET}$ (with $V_{TARGET}=0V$ in the example at issue), it is obtained:

$$V_{T1} \cdot R2 + V_{T2} \cdot R1 = 0$$

As a consequence, since in the considered example $V_{T1}$ and $V_{T2}$ are equal in module and opposite in sign, it is necessary that R1 and R2 have the same value. In such equilibrium condition, since no discharge of the biasing line $L_H$ has not occurred yet, the discharge transistor 410 is turned off, as well as the protection transistor 415; the latter, although it could be turned on (being always in a configuration called "common gate") it does not conduct until the discharge transistor 410 remains turned off.

Starting from a time $t_1=0.1$ µs, the biasing line $L_H$ (i.e., the capacitor $C_{LH}$) starts discharging thanks to the sector dischargers 140. At each pilot voltage variation $\Delta V_P$ at the terminal T2, the terminal Ti undergoes a corresponding voltage variation of equal value; at this point, the operational amplifier 405, detecting a voltage difference across its input terminals, outputs such a signal to turn on the discharge transistor 410 (and thus the protection transistor 415) with an appropriate discharge current; such discharge current, because of the negative feedback, is such as to (negatively) discharge the biasing line $L_W$ (i.e., the capacitor $C_{LW}$) by an amount $\Delta V$ being proportional to the pilot voltage variation $\Delta V_P$; this causes the return of the terminal Ti to the equilibrium voltage (i.e., 0V).

It is possible to evaluate analytically the magnitude of the voltage variation $\Delta V$ with respect to the pilot voltage variation $\Delta V_P$ by imposing the balance of the leakage current through the divider R1,R2:

$$\frac{\Delta V - V_{Ti}}{R1} = \frac{V_{Ti} - \Delta V_P}{R2},$$

from which it follows that $$\Delta V = V_{Ti} \cdot \left(1 + \frac{R1}{R2}\right) - \Delta V_P \cdot \frac{R1}{R2}$$

In the considered example, the voltage variation $\Delta V$ is exactly opposite to the pilot voltage variation $\Delta V_P$. In general, considering instead different values of R1, R2, $V_{HIGH}$ and $V_{LOW}$, it follows that the voltage variation $\Delta V$ turns out to be opposed to the pilot voltage variation $\Delta V_P$, scaled by a scaling factor S given by the ratio of the resistors R1, R2, and shifted by an amount depending on the target voltage $V_{TARGET}$ (i.e., the voltage $V_{Ti}$ in the equilibrium condition) and on the scaling factor S. In other words, the transient trend of the discharge voltage $V_{T1}$ (i.e., of the biasing line $L_W$) turns out to be symmetric to the transient trend of the voltage $V_{T2}$ (i.e., of the biasing line $L_H$) with respect to the target voltage $V_{TARGET}$, and regardless of the value of the capacitive load $C_{LW}, C_{LH}$ being associated with the corresponding biasing line $L_W, L_H$.

The described solution is particularly advantageous since it allows binding in a well defined manner the discharge of the biasing line $L_W$ to the discharge of the biasing line $L_H$, by using a limited number of components, and integratable in a relatively easy manner within the chip. This is obtained with a great manufacturing simplicity and substantially without any impact on an additional area occupation of the flash memory device.

Naturally, in order to satisfy local and specific requirements, a person skilled in the art may apply to the solution described above many logical and/or physical modifications and alterations. More specifically, although the present invention has been described with a certain degree of particularity with reference to embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

In particular, similar considerations apply if the memory device has a different structure or includes equivalent components (either separated to each other or combined together, in whole or in part); for example, the memory device may include more than one microcontroller, or electronic devices being functionally equivalent thereto (such as microprocessors), and combinatory and/or sequential logic blocks for synchronizing the erasing and de-biasing operations. Moreover, the above-exposed voltage values should not be construed in a limitative way for the present invention, as they are to be selected, in the design phase, on the basis of topological and circuital, as well as technological and economic considerations.

The number of sectors of memory cells is not limitative of the present invention, as well as their arrangement within the matrix. Moreover, the memory cells of each sector may be implemented in any configuration (for example, NAND, NOR or a combination thereof).

The biasing lines to be discharged may be in any number, depending on the type of memory device and/or on an operating principle thereof; in the case of more than two lines to be discharged, several central discharge blocks may be provided, being suitably synchronized with each other by appropriate auxiliaries synchronization signals. In any case, although in the present description explicit reference has been made to the erasing and subsequent de-biasing operations, the same solution may be applied in any situation where it is necessary to discharge two (or more) biasing lines at different voltages (and even different to each other).

The bias circuit may be implemented in any way; for example, it may include different circuits based on charge pumps, comparators and/or selectors for selecting one or more biasing lines.

The target value is not limitative of the present invention, since it may be a parameter being specifically chosen during the design phase, or intrinsically given by physical and circuit characteristics of components of the central discharge block (such as, for example, a voltage offset of the operational amplifier, or a voltage imbalance of the divider due to tolerances of the resistors).

The coupling block may include more than one divider; for example, an auxiliary divider may be provided for balancing possible voltage offset due to manufacturing tolerances. In addition or in alternative, the voltage divider may be implemented through resistive or capacitive partitions networks, or a combination thereof; in any case, the possibility of using variable resistors and/or capacitors is not excluded, for example, for trimming the central discharge block thereby eliminating the possible imbalance between the dividers (due, for example, to tolerances of the resistors and/or capacitors).

The resistance values of the resistors of the divider are not limitative of the present invention; for example, it is also possible to provide resistors with value being greater than 1M$\Omega$ (if the integration technologies allow it), so as to reduce the leakage current. Furthermore, the resistance values may also be different to each other, in order to obtain the desired value of the scaling factor; in particular, such scaling factor may be unitary (in case of resistances being equal to each other), or greater or lower than 1.

At least one between the discharge and protection transistors may be of the N-channel MOS type. In addition, the protection transistor might be not necessary (in the case of use of MOS transistors with high breakdown voltages, such as, for example, MOS transistors for power applications) or it might be replaced by equivalent circuit elements (e.g., diodes); moreover, it is possible to provide for the use of more discharge and/or protection transistors being arranged in parallel, so as to reduce resistive paths of the discharge current.

Similar considerations apply if the compensation circuit is not provided, since not necessary, or if it is included within the operational amplifier. In addition, the compensation circuit may be a complex RC network with a transfer function including a plurality of poles and zeros, depending on the implementation of the flash memory device.

Nothing prevents the memory device from being different, for example, of the E$^2$PROM type. In particular, the described solution may be equivalently applied to electrically programmable and erasable non-volatile memory devices based on an operation being similar or related to that of the described flash memory device.

It should be readily understood that the proposed structure may be part of the design of an integrated circuit. The design may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications or microcontrollers).

Moreover, the solution according to an embodiment lends itself to be implemented through an equivalent method (by using similar steps, removing some steps being not essential, or adding further optional steps); moreover, the steps may be performed in different order, concurrently or in an interleaved way (at least partly).

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electrically programmable non-volatile memory device being integrated on a chip of semiconductor material, the memory device including a plurality of sectors of memory cells each one being formed in a respective well of the chip and each sector including a plurality word lines each one for accessing a corresponding block of memory cells of the sector, wherein the memory device includes:
    a first biasing line of the wells and a second biasing line of the word lines,
    biasing means for providing a first bias voltage to the first biasing line and a second bias voltage to the second biasing line,
    selection means for selectively connecting the first biasing line to the well of at least one selected sector and for selectively connecting the second biasing line to at least one selected word line of each selected sector,
    first charge transfer means for bringing the first biasing line from the first bias voltage to a target voltage according to a pilot transient trend, the target voltage being comprised between the first bias voltage and the second bias voltage,
    second charge transfer means for bringing the second biasing line from the second bias voltage to the target voltage, wherein the second charge transfer means includes means for binding the second biasing line to bring itself from the second bias voltage to the target voltage according to a transient trend being scaled with respect to the pilot transient trend.

2. The memory device according to claim 1, wherein the second charge transfer means includes:
    coupling means for coupling the first biasing line and the second biasing line so as to convert any pilot voltage variation at the first biasing line into a voltage variation being scaled with respect to the pilot voltage variation at the second biasing line.

3. The memory device according to claim 2, wherein the coupling means includes:
    a resistive divider having a first terminal being connected to the first biasing line, a second terminal being connected to the second biasing line, and a central terminal, and
    fixing means for fixing the central terminal to the target voltage without current absorption.

4. The memory device according to claim 3, wherein the resistive divider includes a first resistor having a first resistance and a second resistor having a second resistance being connected in series between the first biasing line and the second biasing line, a ratio between the first resistance and the second resistance defining a scaling ratio between the pilot transient trend and the scaled transient trend.

5. The memory device according to claim 4, wherein the first resistance is equal to the second resistance, the target voltage being in the middle between the first bias voltage and the second bias voltage.

6. The memory device according to claim 3, wherein the fixing means includes regulation means for receiving the target voltage and regulating the central terminal of the resistive divider in negative feedback.

7. The memory device according to claim 6, wherein the regulation means includes:
   a supply transistor having a first conduction terminal for receiving a supply voltage, a second conduction terminal being coupled to the second biasing line, and a control terminal,
   an operational amplifier having a non-inverting terminal for receiving the target voltage, an inverting terminal being connected to the central terminal of the resistive divider, and an output terminal being connected to the control terminal of the supply transistor.

8. The memory device according to claim 7, wherein the regulation means further includes a protection transistor for protecting the supply transistor from over-voltages, the protection transistor having a first conduction terminal being connected the second conduction terminal of the supply transistor, a second conduction terminal being connected to the second biasing line, and a control terminal for receiving a ground voltage.

9. The memory device according to claim 7, further including a frequency compensation circuit including:
   capacitive means having a first terminal being connected to the output terminal of the operational amplifier, and a second terminal, and
   resistive means having a first terminal being connected to the second terminal of the capacitive means and a second terminal being connected to the second biasing line.

10. The memory device according to claim 1, wherein the memory device is of the Flash type, the first bias voltage and the second bias voltage being a first erasing voltage and a second erasing voltage, respectively.

11. A method for controlling a charge transfer in an electrically programmable non-volatile memory device being integrated on a chip of semiconductor material, the memory device including a plurality of sectors of memory cells each one being formed in a respective well of the chip and each sector including a plurality of word lines each one for accessing a corresponding block of memory cells of the sector, wherein the method includes the steps of:
   providing a first bias voltage to a first biasing line of the wells and a second bias voltage to a second biasing line of the word lines,
   selectively connecting the first biasing line to the well of at least one selected sector and selectively connecting the second biasing line to at least one selected word line of each selected sector,
   bringing the first biasing line from the first bias voltage to a target voltage according to a pilot transient trend, the target voltage being comprised between the first bias voltage and the second bias voltage,
   bringing the second biasing line from the second bias voltage to the target voltage by binding the second biasing line to bring itself from the second bias voltage to the target voltage according to a transient trend being scaled with respect to the pilot transient trend.

* * * * *